United States Patent [19]

Becker

[11] Patent Number: 5,090,563

[45] Date of Patent: Feb. 25, 1992

[54] ELECTRO-STATIC PROTECTIVE CONTAINER FOR ELECTRICAL COMPONENTS

[75] Inventor: Raymond P. Becker, Gurnee, Ill.

[73] Assignee: Conductive Containers, Inc., Northbrook, Ill.

[21] Appl. No.: 644,032

[22] Filed: Jan. 18, 1991

Related U.S. Application Data

[63] Continuation-in-part of Ser. No. 475,334, Feb. 5, 1990, Pat. No. 5,014,849.

[51] Int. Cl.⁵ .................... B65D 73/02; B65D 85/20; B65D 11/58
[52] U.S. Cl. ..................................... 206/328; 206/334
[58] Field of Search ................... 206/328, 334; 53/449

[56] References Cited

U.S. PATENT DOCUMENTS 2,899,050 8/1959 Collins, Jr. .................... 206/328

Primary Examiner—William I. Price
Attorney, Agent, or Firm—Arnold, White & Durkee

[57] ABSTRACT

A shipping tube for carrying static-sensitive electrical components (e.g., IC chips in DIP tubes) is provided to protect the electrical components from damage caused by the discharge of electro-static charges and/or moisture. In one embodiment, the shipping tube includes a hollow cylindrically-shaped body and a pair of electrically conductive end caps. The hollow cylindrical body includes a laminate of paperboard and layers of electrically conductive material on both the inner and outer surface of the paperboard. The electrically conductive end caps close the opposite ends of the hollow cylindrical body, and at least one of the end caps is removable. Further, at least one of the end caps makes conductive contact with the conductive material on both the inner and outer surfaces of the paperboard to provide a complete enveloping enclosure.

5 Claims, 2 Drawing Sheets

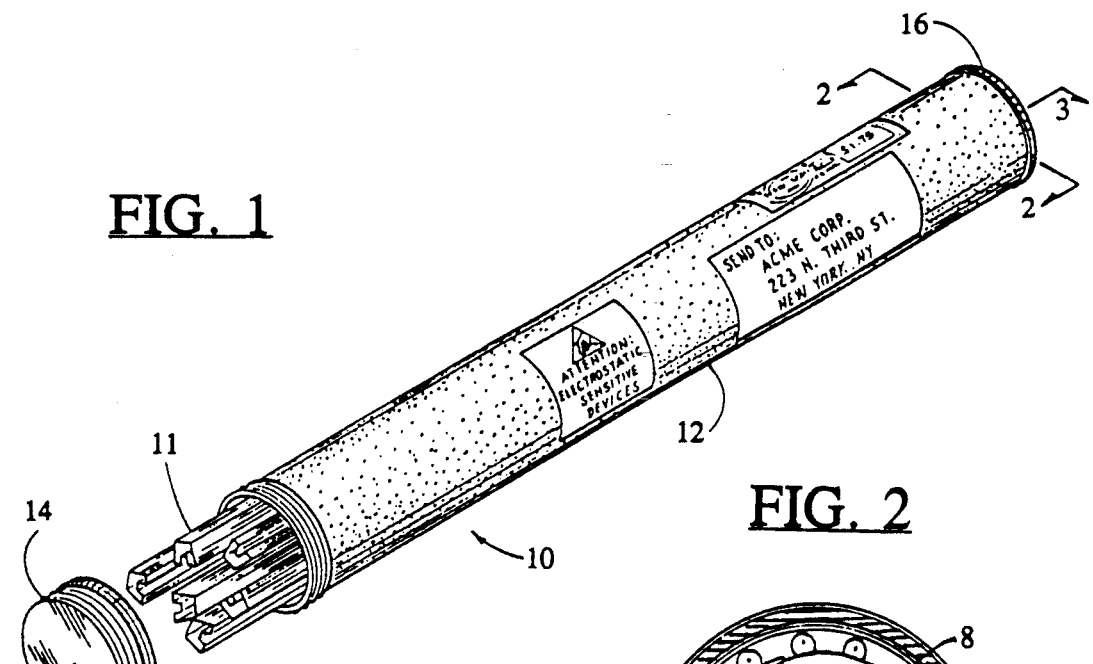
FIG. 1
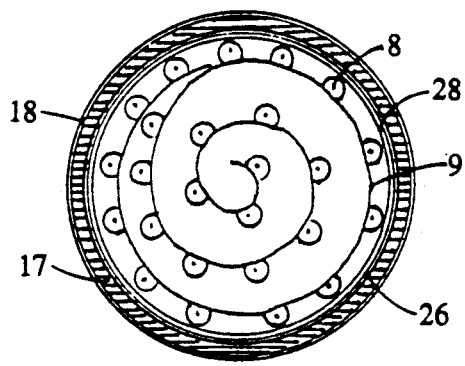
FIG. 2
FIG. 3
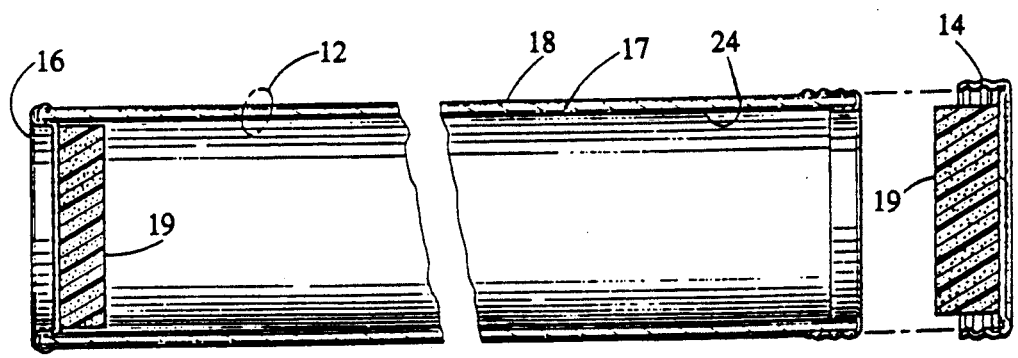

ELECTRO-STATIC PROTECTIVE CONTAINER FOR ELECTRICAL COMPONENTS

RELATED APPLICATION

This is a continuation-in-part of U.S. patent application Ser. No. 07/475,334, filed on Feb. 5, 1990, entitled ELECTRO-STATIC PROTECTIVE CONTAINER FOR ELECTRICAL COMPONENTS.

FIELD OF THE INVENTION

The present invention relates generally to containers for electrical components, and, more particularly, to containers for protecting integrated circuit chips and other types of electrical components from a discharge of electro-static charges.

BACKGROUND OF THE INVENTION

The discharge of electro-static charges has become a large problem for the electronics industry. Electro-static charges originate in different ways but most commonly by movement of a person about the floor, so that a charge passes from the person's hand to the electrical circuitry. This often results in critical circuit damage.

Circuits that experience damage resulting from electro-static charges are commonly packaged in semiconductor integrated circuit (IC) chips that include highly voltage-sensitive circuits, such as MOS (metal oxide semiconductor) transistors. Due to their sensitivity to high voltages, containers for storing and shipping these types of IC chips must offer significant protection to avoid damage of the IC chips by electro-static charges.

Most IC chips are manufactured in the form of dual-in-line packages (DIP) and are stored and shipped in DIP tubes, depicted as 11 in FIG. 1. DIP tubes include a cross-section having the shape of a DIP IC and a length sufficient to hold a series of such IC chips therein. DIP tubes are typically shipped from manufacturing facilities in large boxes to distributors. From the distributors, the boxes containing the DIP tubes are typically separated and repackaged for sales to the distributors' customers.

While repackaged by the distributors, it is a major concern to prevent a discharge of electro-static charges from damaging the electrical components. Because DIP tubes, by themselves, provide insufficient protection from electro-static discharges, it is desirable to package and ship DIP tubes in such a way that such discharges are avoided. Various types of devices have been designed and severe precautions have been taken to accomplish this goal. Common examples include the placement of DIP tubes (carrying IC chips) in a separate anti-static bag before being packaged in a container for shipping, and the use of corrugated boxes with metallic lining on their inside panels. Unfortunately, the practice of using separate anti-static bags before repackaging is costly, laborious and difficult to enforce, and metallic lining used in corrugated boxes often tears away and falls into and subsequently damages the circuitry. Other problems with these prior art practices involve moisture that migrates into the containers and causes corrosion, and the excessive and inconvenient unpacking of the DIP tubes from their containers.

These problems concerning protection from electro-static discharges are not limited to IC chips which may be carried in DIP tubes. Other types of electrical components experience similar problems. Consider, for example, electrical components, such as discrete capacitors, transistors and resistors, that are dispensed from reels for automatic-insertion applications. A single discharge of electro-static charges can easily damage a multitude of these components.

Accordingly, there is need for a container that provides protection to electrical components from electro-static discharges and that overcomes the above shortcomings.

OBJECTS AND SUMMARY OF THE INVENTION

An important object of the present invention is to provide a cost-effective protective container for electrical components that are subject to damage from the discharge of electro-static charges and other adverse conditions.

Another important object of the present invention is to provide an electro-static protective container which may be used for shipping either DIP tubes carrying IC chips or electrical components dispensed on automatic-insertion reels.

Another object of the present invention is to provide a protective container which protects electrical components contained therein from the discharge of electro-static charges, and, at the same time, allows the components to be unpacked in a simple and convenient manner.

Yet another object of the present invention is to provide such a container that can be conveniently used from the point of electrical component manufacturing to the point at which the components are used.

In accordance with a preferred embodiment of the present invention, a protective container for electrical components is provided to protect the components from damage caused by the discharge of electro-static charges. The container includes a hollow body and a pair of electrically conductive end caps. The hollow body includes a laminate of paperboard and at least one layer of electrically conductive material, preferably on the outer surfaces of the paperboard. The electrically conductive end caps close the opposite ends of the hollow body, and at least one of the end caps is removable. Further, at least one of the end caps makes conductive contact with the conductive material to provide a complete enveloping enclosure.

The hollow body is preferably cylindrically shaped and also includes a layer of conductive foil. The conductive foil serves as an EMI, RFI and ESD shield as well as a vapor barrier to prevent the migration of vapors into the interior of the tube.

The layers of the cylindrical body may be made up of a variety of materials. For example, at least one of the layers of conductive material may include a metallized non-woven fabric or a coating of conductive material, such as carbon, on or impregnated in the surface of the paperboard. Such materials provide the necessary electro-static protection to the integrated circuits.

Additionally, the cylindrical body may include threads formed in the outer surface thereof at one end, and one of the end caps may be threaded onto the threads formed in the cylindrical body.

As an alternative to the above described embodiment, the present invention provides a protective container including a hollow elongated body having a square-like shape, i.e., two pairs of parallel sides. This design allows a number of printed circuit boards to be inserted inside the protective container. The design also allows similarly constructed, but smaller containers to be inserted inside the original container for unpacking convenience and electro-static free handling.

In one embodiment, the hollow body includes a first part and a second part, and the end caps are integrally secured to the respective first and second parts. The outside diameter of the first part and the inside diameter of the second part are approximately the same dimension so that they slidably and removably interlock.

BRIEF DESCRIPTION OF THE DRAWINGS

Other objects and advantages of the invention will become apparent upon reading the following detailed description and upon reference to the drawings in which:

FIG. 1 is a perspective view of a protective container, according to the present invention;

FIG. 2 is a cross-sectional view of the protective container of FIG. 1 along line 2—2 in FIG. 1;

FIG. 3 is a cross-sectional view of the protective container of FIG. 1 along line 3—3 in FIG. 1;

Figure 4:
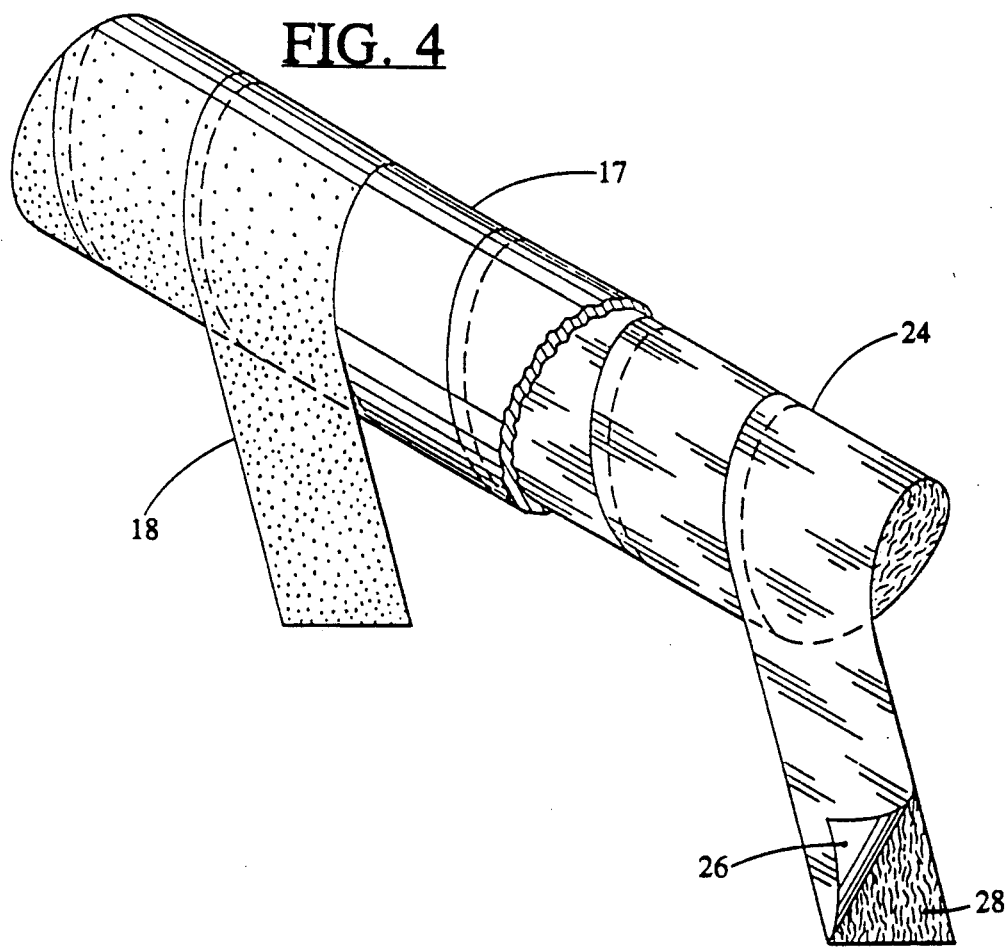
FIG. 4 is a perspective view of the protective container of FIG. 1, with layers of the body portion of the protective container cut-away; and form of the container described in connection with the previous figures.

While the invention is susceptible to various modifications and alternative forms, a specific embodiment thereof has been shown by way of example in the drawings and will herein be described in detail. It should be understood, however, that it is not intended to limit the invention to the particular forms disclosed. On the contrary, the intention is to cover all modifications, equivalents, and alternatives falling within the spirit and scope of the invention as defined by the appended claims.

DETAILED DESCRIPTION OF THE PREFERRED EMBODIMENTS

The present invention may be used in many applications requiring the packaging of electrical components. The present invention is particularly advantageous for packaging discrete electrical components such as resistors, capacitors and transistors dispensed on automatic insertion reels ("auto insert reels") and for packaging DIP tubes carrying IC chips. Although FIG. 1 illustrates one embodiment of the present invention containing such DIP tubes 11, the shape of that embodiment easily accommodates electrical components 8 dispensed on auto insert reels 9 (FIG. 2) as well as DIP tubes.

In FIG. 1, a protective container 10 is shown including a hollow cylindrical body 12 and two end caps 14 and 16. The first end cap 14 is removably attached to the body 12 using conventional threading means to allow for the insertion and removal of the electrical components contained therein. These elements provide the electrical components with protection from structural damage, protection from the discharge of electro-static charges and protection from moisture which migrate into the interior of the body 12. With regard to structural protection, the body 12 and end caps 14 and 16 provide rigid support for the DIP tubes 11 and/or electrical components that are shipped therein. Because of the rugged environments packaging containers are typically subjected to, it is preferred that the end caps 14 and 16 be constructed of a durable metal, such as tin or aluminum, and that the hollow cylindrical body 12 includes a relatively thick layer 17 of paperboard. The thicknesses of the metal in the end caps 14 and 16 and of the layer 17 may vary depending on the application and the desired structural protection.

Cylindrically shaped foam disks 19 are preferably adhered to the inside of each end cap 14 and 16, as illustrated in FIG. 3, to lessen the impact on components during shipping and handling.

The protective container 10 in FIG. 1 protects electrical components from damage that may result from the discharge of electro-static charges using a construction that provides a Faraday "cage" effect. A Faraday cage is recognized in the art as a substantially enclosed conductive structure. The effect of the Faraday cage on an electro-static charge occurs when the cage is not grounded or otherwise connected to a voltage reference. Because the cage is substantially enclosed and isolated from any such reference, an electro-static charge held on the cage has no path through which the charge may dissipate. This forces the charge to circulate about and dissipate from surface of the cage into the surrounding atmosphere.

In accordance with the present invention, the Faraday cage effect is provided in the protective container 10 by implementing both end caps 14 and 16 using a conductive material, such as aluminum, and by implementing the body 12 in the form of a laminate, with a conductive layer 18 on its outer surface adjacent the paperboard layer 17. Thus, in addition to providing structural support, the end caps 14 and 16 are used in conjunction with the outer surface of the body 12 to provide protection from electro-static discharge. The conductive layer 18 is preferably implemented using carbon-coated or carbon-impregnated paper (depicted as 20 in FIG. 4), but may also be implemented using other types of conductive materials such as Tyvek ® with foil adhered thereto or Tyvek ® with a metallized film on one side. Tyvek ® is a well-known, commercially available non-woven fabric.

Preferably, the laminated body 12 includes a layer 24 on its inner surface which is also used to protect the electrical components from damage ensuing from electro-static discharges. Although a protective conductive layer 18 on only the outer surface of the body 12 provides a Faraday cage effect, properly including such a conductive layer 24 on the inner side of the layer 17 ensures that an electro-static charge on either the inner or outer surface of the body 12 will be dissipated into the surrounding atmosphere or to ground.

Accordingly, one of the previously discussed conductive materials, or its equivalent, should be used in implementing the layer 24. The static dissipative side 28 of the layer 24 should face the inside of the container 10 to reduce the possibility of the conductive material tearing away and falling into the circuitry contained therein. This configuration is illustrated in FIGS. 2 and 4 which show Tyvek ® 28 with foil 26 as the layer 24.

The container 10 should include means for providing a conductive path between the layers 18 and 24 of electrically conductive material. This may be accomplished, as illustrated in FIG. 3, using the edge of the conductive side 26 of the inner layer 24 contacting the conductive end cap 16. Alternatively, the conductive side 26 of the layer 24 may face the inside of the container 10, and one or both of the end caps 14 and 16 may be may be used to provide the conductive path between the layers 18 and 24 of electrically conductive material.

The conductive container 10 also serves to protect the electrical components stored therein from the migration of vapors which may enter the container 10. This vapor barrier function may be accomplished using a vapor resistant material in addition to one of the layers 17, 18 or 24 or as part of one of these layers. Preferably, the inside layer 24 of the laminate acts to serve both the metallization and vapor barrier functions. This may be accomplished using Tyvek ® with foil adhered thereto or using a carbon-coated or carbon-impregnated paper. Other alternatives include the use of an electro-static dissipating polyethylene foam in combination with a material providing a vapor barrier, and a metallized film on a material providing a vapor barrier.

FIG. 4 illustrates the hollow cylindrically shaped body with the outer metallized and middle paperboard layers 18 and 17 partially peeled and cut away, revealing the inside metallized layer 24. Each of these three layers 18, 17 and 24 may be manufactured from rolls of the materials previously discussed. The seams used in forming the materials into the body 12 overlap from one layer to the next to provide extra strength to the body 12.

Figure 5:
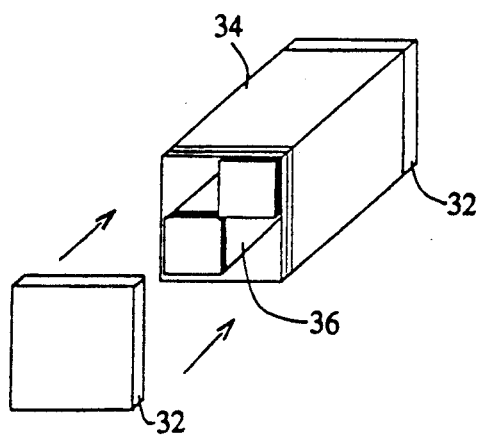

Another embodiment contemplated as part of the present invention includes the same materials and basic laminated structure discussed above with respect to the protective container illustrated in FIG. 1, but, as shown in FIG. 5, with end caps 32 and a body 34 having a square-like shape rather than a cylindrical shape. In this embodiment, the end caps 32 would be similarly constructed to accommodate the change, with at least one end cap snapping on and off. By modifying the protective container of FIG. 1 to include two pairs of parallel sides rather than the cylindrical side wall of the body 12, the container can be used to package a variety of other kinds of electrical devices in a space efficient manner. For example, it may be used to package and protect rectangularly shaped printed circuit boards ("PCB"), with each PCB stacked so that its edges or surfaces face the end caps.

Such a shape may also be used to contain smaller but similarly constructed containers, 36 each carrying electrical components (e.g., in DIP tubes). This permits segregated packaging and shipping of electrical components for customers desiring to remove the smaller containers 36 for further distribution, while protecting the electrical components therein from electro-static discharges which might otherwise occur during such removal.

This type of application is ideal for shipping electrical components from an IC distributor or manufacturer to a factory which uses the various electrical components at different stations in the factory. For example, consider the situation of a hypothetical manufacturer (Acme Corp.) of printed circuit boards to which different types of IC chips are soldered. From IC Distributor Inc., Acme Corp. orders five IC types, each IC type being used at a different station within the facility of Acme Corp. Being informed of this application, Distributor Inc. fills the order by inserting the requisite number of IC chips in associated DIP tubes, then inserting the DIP tubes within a first size of protective containers (each being constructed in accordance with the present invention). This is done such that all IC chips of the same type are included in one of the protective containers of the first size. A label is placed on the outer surface of each protective container to indicate the type of IC chips contained therein, and those containers are inserted (with or without other loose DIP tubes) in a protective container of a second size, larger than the first size and also constructed in accordance with the present invention. A mailing label and the requisite postage are attached to the outer surface of the larger protective container (see FIG. 1), and the larger container is mailed to Acme Corp. At Acme Corp., the smaller containers are removed from the larger container and are distributed to the various stations using the designated types of IC chips contained therein. Thus, Acme Corp. is able to remove and distribute the smaller containers to the appropriate stations without having to subject any IC chips to a discharge of electrostatic charges which may result from individual handling.

Figure 6:
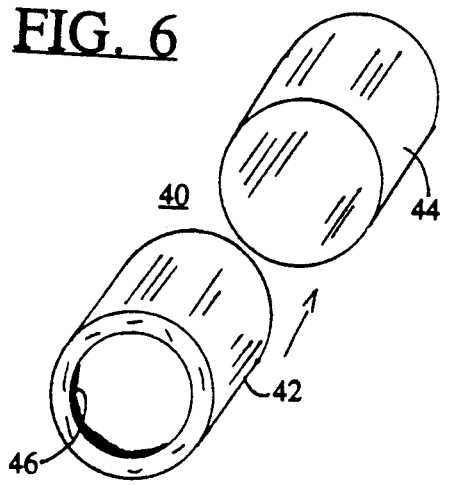
FIG. 6 is a perspective view of an alternative shape of the protective container described in connection with FIG. 1.

FIG. 6 illustrates yet another shape 40 of the hollow cylindrical body 12 of FIG. 1; the form of the protective container 40 is, therefore, also constructed in accordance with the present invention. As shown in FIG. 6, however, the protective container 40 includes both end caps secured as an integral part of the hollow cylindrical body 40.

Like the structure of FIG. 1, the container 40 includes a first part 42 which fits inside a second part 44. The outside diameter of the first part 42 and the inside diameter of the second part 44 are approximately the same dimension so that they slidably and removably interlock. The illustrated rim 46, against which the respective end cap is adhered, is formed by the inwardly shaped end of the cylindrical portion of each of the two parts 42 and 44. The hollow body is cylindrically shaped, as illustrated.

Accordingly, the present invention provides a protective container for packaging, storing and mailing static-sensitive electrical components in a manner that provides more than adequate protection, and which is also extremely convenient for the users of the electrical components.

Those skilled in the art will recognize that various other modifications may be made to the present invention without departing from its scope, which is set forth in the following claims.

What is claimed is:

1. A protective container for electrical components which are susceptible to damage from the discharge of electro-static charges, the container comprising;
   a first part having a hollow body including a laminate of paperboard and first and second layers of electrically material adjacent the inside and the outside surfaces of the paperboard, and an end portion, integrally secured to the hollow body, including a laminate of paperboard and at least one layer of electrically conductive material making conductive contact with the conductive material of the hollow body; and
   a second part having a hollow body including a laminate of paperboard and first and second layers of electrically conductive material adjacent the inside and the outside surfaces of the paperboard, and an end portion, integrally secured to the hollow body, including a laminate of paperboard and at least one layer of electrically conductive material making conductive contact with the conductive material of the hollow body;
   wherein the outside diameter of the first part and the inside diameter of the second part are approximately the same dimension so that they slidably and removably interlock.

2. A protective container for electrical components which are susceptible to damage from the discharge for electro-static charges, according to claim 1, wherein each of the respective hollow bodies is cylindrically shaped.

3. A protective container for electrical components which are susceptible to damage from the discharge of electro-static charges, the container comprising:
- a first part having a hollow body including a laminate of paperboard and layers of electrically conductive material adjacent both surfaces of the paperboard, and an electrically conductive end portion, integrally secured to and electrically coupled to the hollow body; and
- a second part having a hollow body including a laminate of paperboard and layers of electrically conductive material adjacent both surfaces of the paperboard, and another end portion, integrally secured to the hollow body, including a laminate of paperboard and at least one layer of electrically conductive material making conductive contact with the conductive material of the hollow body;
- wherein the outside diameter of the first part and the inside diameter of the second part are approximately the same dimension.

4. A protective container for electrical components which are susceptible to damage from the discharge of electro-static charges, according to claim 3, wherein said other end cap is also electrically conductive and electrically coupled to the hollow body.

5. A protective container for electrical components which are susceptible to damage from the discharge of electro-static charges, the container comprising:
- a first part having a cylindrically shaped hollow body including a laminate of paperboard and layers of electrically conductive material adjacent both surfaces of the paperboard, and an electrically conductive end portion, integrally secured to and electrically coupled to the hollow body; and
- a second part having a cylindrically shaped hollow body including a laminate of paperboard and layers of electrically conductive material adjacent both surfaces of the paperboard, and another electrically conductive end portion, integrally secured to and electrically coupled to the hollow body, including a laminate of paperboard and at least one layer of electrically conductive material making conductive contact with the conductive material of the hollow body;
- wherein the outside diameter of the first part and the inside diameter of the second part are approximately the same dimension.

* * * * *